(12) United States Patent
Kurafuji et al.

(10) Patent No.: US 10,366,758 B2
(45) Date of Patent: Jul. 30, 2019

(54) STORAGE DEVICE AND STORAGE METHOD

(71) Applicant: Renesas Electronics Corporation, Tokyo (JP)

(72) Inventors: Takashi Kurafuji, Tokyo (JP); Tomoya Ogawa, Tokyo (JP); Yasuhiko Taito, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/900,516

(22) Filed: Feb. 20, 2018

(65) Prior Publication Data

US 2018/0277214 A1  Sep. 27, 2018

(30) Foreign Application Priority Data

Mar. 21, 2017 (JP) .................................. 2017-054425

(51) Int. Cl.
| | | |
|---|---|---|
| G11C 16/28 | (2006.01) | |
| G11C 16/04 | (2006.01) | |
| G11C 7/06 | (2006.01) | |
| G11C 7/10 | (2006.01) | |
| G11C 16/26 | (2006.01) | |
| G11C 16/30 | (2006.01) | |
| G11C 16/10 | (2006.01) | |
| G11C 16/14 | (2006.01) | |

(52) U.S. Cl.
CPC .......... *G11C 16/0441* (2013.01); *G11C 7/062* (2013.01); *G11C 7/1063* (2013.01); *G11C 16/10* (2013.01); *G11C 16/14* (2013.01); *G11C 16/26* (2013.01); *G11C 16/28* (2013.01); *G11C 16/30* (2013.01); *G11C 7/1006* (2013.01); *G11C 2207/063* (2013.01)

(58) Field of Classification Search
None
See application file for complete search history.

(56) References Cited

U.S. PATENT DOCUMENTS

| | | | | |
|---|---|---|---|---|
| 5,943,263 | A | * | 8/1999 | Roohparvar ........... G11C 5/143 365/185.18 |
| 2006/0062041 | A1 | * | 3/2006 | Hiraka ..................... G06F 3/061 365/145 |
| 2008/0089146 | A1 | | 4/2008 | Fujito et al. |
| 2009/0225593 | A1 | * | 9/2009 | Cha ..................... G11C 11/5642 365/185.03 |
| 2009/0254696 | A1 | | 10/2009 | Kasai et al. |
| 2016/0064095 | A1 | | 3/2016 | Kato et al. |

FOREIGN PATENT DOCUMENTS

JP     2008-117510 A     5/2008

OTHER PUBLICATIONS

European Search Report dated Jul. 26, 2018 for European Patent Application No. 18161136.9-1203.

* cited by examiner

*Primary Examiner* — Douglas King
(74) *Attorney, Agent, or Firm* — McGinn I.P. Law Group, PLLC.

(57) ABSTRACT

A storage device includes a data memory unit and a status memory unit. The data memory unit includes a pair of flash memory cells to be read by a complementary read mode, and 1-bit data is stored therein by the pair of flash memory cells. The status memory unit includes a flash memory cell to be read by a reference read mode, and a status flag is stored therein by the flash memory cell.

9 Claims, 14 Drawing Sheets

| | COMMAND DATA TO FLASH SEQUENCER | | | |
|---|---|---|---|---|
| | 1ST TIME | 2ND TIME | 3RD~(N+2) TIME | (N+3) TH TIME |
| DATA WRITE<br>4 BYTE WRITE : N=2<br>16 BYTE WRITE : N=8 | H' E8 | H' 02 (=N)<br>H' 08 (=N) | DATA TO BE WRITTEN<br>TO FLASH MEMORY | H' D0 |
| DATA ERASE | H' 20 | H' D0 | - | - |

Fig. 11

STORAGE DEVICE AND STORAGE METHOD

CROSS-REFERENCE TO RELATED APPLICATIONS

This application is based upon and claims the benefit of priority from Japanese patent application No. 2017-054425, filed on Mar. 21, 2017, the disclosure of which is incorporated herein in its entirety by reference.

BACKGROUND

The present invention relates to a storage device and a storage method and, for example, relates to a storage device that stores a status flag and a storage method.

A complementary read flash memory is known as described in, for example, Japanese Unexamined Patent Application Publication No. 2008-117510. In the complementary read flash memory, two rewritable nonvolatile memory cells form a pair, and 1-bit information is stored in the one pair of memory cells (which can be also referred to hereinafter as a twin cell). The cells that constitute the twin cell can be in either a low threshold voltage state or a high threshold voltage state. The low threshold voltage state is a state where a threshold voltage (Vth) of a transistor that forms a cell is lower than a specified reference value. The high threshold voltage state is a state where a threshold voltage (Vth) of a transistor that forms a cell is equal to or higher than the specified reference value.

In the complementary read flash memory, information is stored by setting two memory cells that form a twin cell to threshold voltage states different from each other. Specifically, for example, a value of "0" is stored when a first memory cell of a twin cell is in the high threshold voltage state and a second memory cell of the twin cell is in the low threshold voltage state. On the other hand, a value of "1" is stored when the first memory cell is in the low threshold voltage state and the second memory cell is in the high threshold voltage state. Further, when both the first memory cell and the second memory cell are in the low threshold voltage state, they are in an erased state (which is also called an initialized state). In the case of the erased state, a read result from the twin cell is undefined. Specifically, a read value can be "1" or can be "0", which is not a uniquely defined value.

SUMMARY

There is a case of storing a status flag indicating a data storage status or the like into a flash memory. In the case of storing the status flag into the above-described twin cell, a read result after erasing the value of the status flag, which is a read result after the twin cell enters into the erased state, is undefined.

The threshold voltages of the memory cells of the twin cell in the erased state tend to maintain the same relationship with each other as that before erasure. Thus, if the twin cell with the value "0" is erased and then this twin cell is read, a value of "0" is likely to be read. Likewise, if the twin cell with the value "1" is erased and then this twin cell is read, a value of "1" is likely to be read. Therefore, when the status flag is stored in the twin cell, there is a possibility that a value before erasure may be read even after erasure is done. Thus, there is a possibility that a false status flag value could be read.

The other problems and novel features of the present invention will become apparent from the description of the specification and the accompanying drawings.

According to one exemplary embodiment, a storage device includes a data memory unit that is read by a complementary read mode and stores data, and a status memory unit that is read by a reference read mode and stores a status flag.

According to the one exemplary embodiment described above, it is possible to store data by a complementary read mode and uniquely define a value of a status flag after erasure.

BRIEF DESCRIPTION OF THE DRAWINGS

The above and other aspects, advantages and features will be more apparent from the following description of certain embodiments taken in conjunction with the accompanying drawings, in which:

FIG. 11 is a view showing commands of a flash sequencer.

DETAILED DESCRIPTION

The following description and the attached drawings are appropriately shortened and simplified to clarify the explanation. In the figures, the identical reference symbols denote identical structural elements and the redundant explanation thereof is omitted.

<Overview of Exemplary Embodiment>

Figure 1:
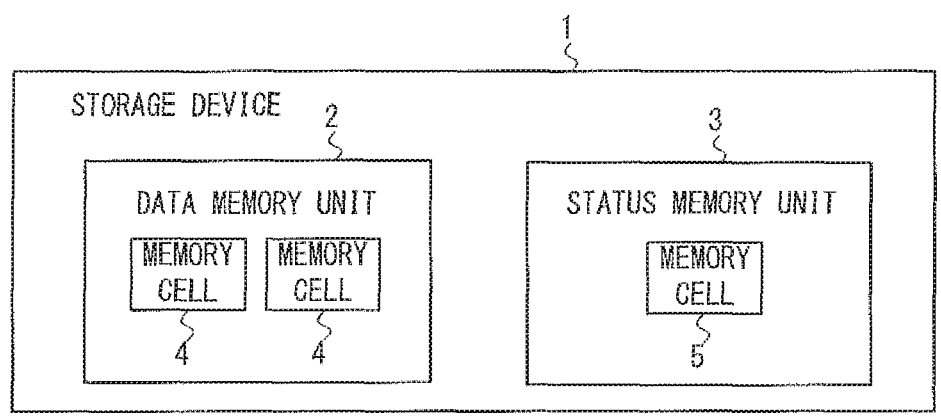
FIG. 1 is a block diagram showing one example of a storage device according to the overview of an exemplary embodiment.

Prior to describing the details of an exemplary embodiment, the overview of the exemplary embodiment is described first. FIG. 1 is a block diagram showing one example of a storage device 1 according to the overview of the exemplary embodiment. As shown in FIG. 1, the storage device 1 includes a data memory unit (data memory circuit) 2 and a status memory unit (status memory circuit) 3.

The data memory unit 2 includes a pair of flash memory cells 4. The pair of flash memory cells 4 is read by a complementary read mode. 1-bit data is stored in this pair of flash memory cells 4. Specifically, the pair of flash memory cells 4 is a twin cell where one flash memory cell 4 is in the low threshold voltage state and the other flash memory cell 4 is in the high threshold voltage state to thereby store 1-bit data. Because the data memory unit 2 is read by the complementary read mode, data is read by comparing a current flowing through one flash memory cell 4 of the twin cell with a current flowing through the other flash memory cell 4 of the twin cell. A current that flows through a memory cell differs according to a threshold voltage of the memory cell. Therefore, it is possible to detect the state of the threshold voltage of the twin cell by comparing the current flowing through the one flash memory cell 4 of the twin cell with the current flowing through the other flash memory card 4 of the twin cell, thereby enabling reading of data. Note that, although the storage device 1 includes one data memory unit 2 in the example shown in FIG. 1, the storage device 1 may include a plurality of data memory units 2. Specifically, the storage device 1 may include a plurality of pairs of twin cells.

The status memory unit 3 includes at least one flash memory cell 5. The flash memory cell 5 is read by a reference read mode. 1-bit information is stored in the one flash memory cell 5. Note that a status flag is stored in the flash memory cell 5 of the status memory unit 3. The status flag is a flag indicating the status of an arbitrary specified target.

In the reference read mode also, information is stored by changing the threshold voltage of the flash memory cell 5. Specifically, 1-bit information is stored depending on whether the threshold voltage is equal to or higher than a reference value (i.e., in the high threshold voltage state) or lower than a reference value (i.e., in the low threshold voltage state). For example, a value of "0" is stored when the flash memory cell 5 is in the high threshold voltage state, and a value of "1" is stored when the flash memory cell 5 is in the low threshold voltage state. In the case of the reference read mode, the threshold voltage is changed to a predetermined voltage after erasing is carried out. More specifically, the flash memory cell 5 is set, for example, to the low threshold voltage state by erasing. Therefore, in the reference read mode, a read result after erasing is a uniquely determined one. Specifically, a read result is a value of "1", for example, in the case where the flash memory cell 5 is set to the low threshold voltage state by erasing.

The status memory unit 3 is read by the reference read mode, and the status flag is read by comparing a current flowing through the flash memory cell 5 with a reference current. Because the reference current has a constant current value, it is possible to detect the state of the threshold voltage of the flash memory cell 5 by comparing a current flowing through the flash memory cell 5 with the reference current, thereby enabling reading of data. Note that, although the storage device 1 includes one status memory unit 3 in the example shown in FIG. 1, the storage device 1 may include a plurality of status memory units 3.

In the storage device 1, data, which is information other than the status flag, is stored in the data memory unit 2 that is read by the complementary read mode, and the status flag is stored in the status memory unit 3 that is read by the reference read mode. Therefore, a read result of the status flag after erasing is a uniquely defined one. It is thereby possible in the storage device 1 to store data by the complementary read mode and uniquely define the value of the status flag after erasure.

<First Exemplary Embodiment>

Figure 2:
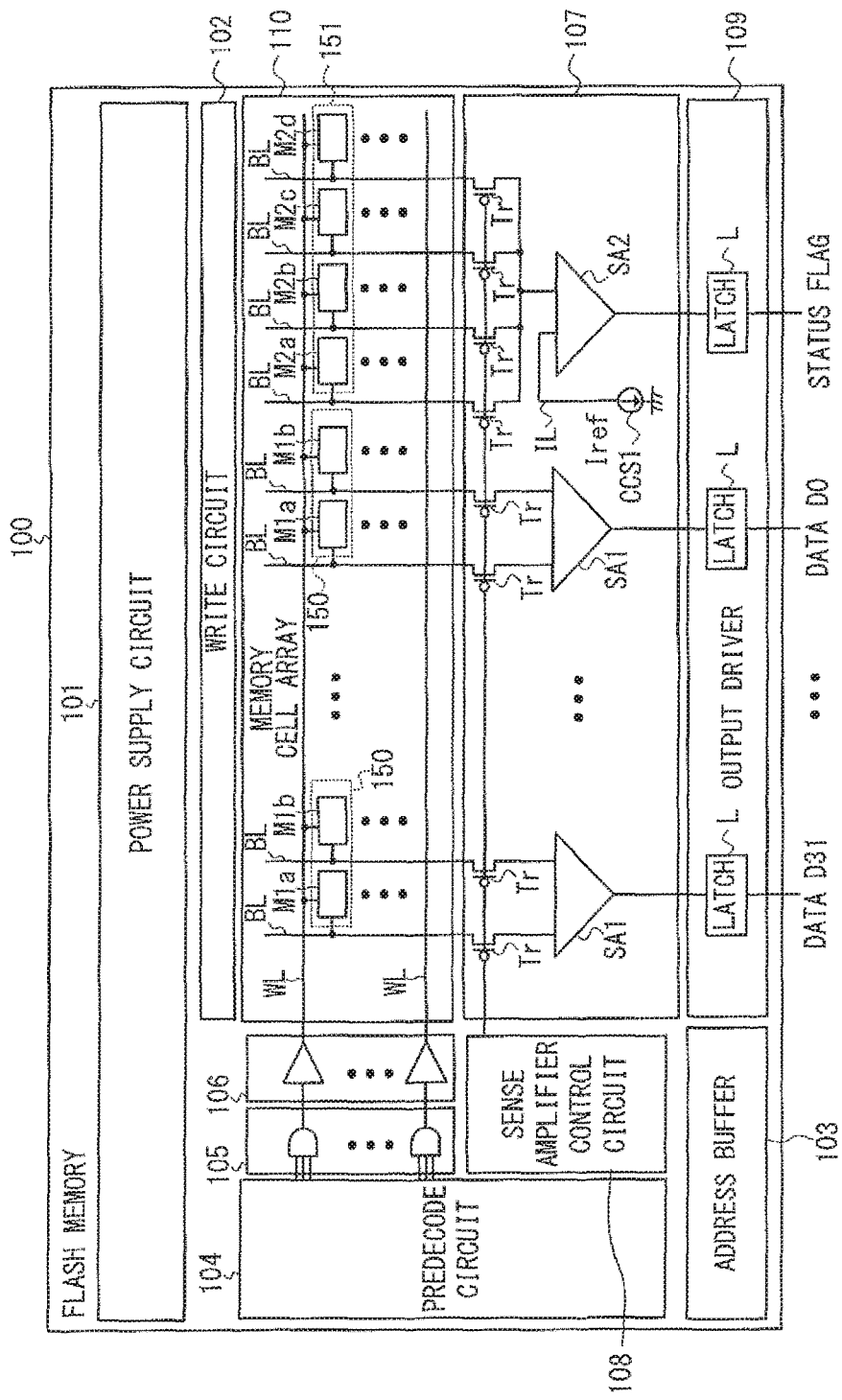
FIG. 2 is a block diagram showing a configuration example of a flash memory according to a first exemplary embodiment.

Details of the exemplary embodiment are described hereinbelow. FIG. 2 is a block diagram showing a configuration example of a flash memory 100 according to a first exemplary embodiment. Note that the flash memory 100 corresponds to the storage device 1 shown in FIG. 1. As shown in FIG. 2, the flash memory 100 includes a power supply circuit 101, a write circuit 102, an address buffer 103, a predecode circuit 104, a decoder 105, a WL driver 106, a sense amplifier circuit 107, a sense amplifier control circuit 108, an output driver 109, and a memory cell array 110.

The power supply circuit 101 is a circuit that supplies power to be used for writing, erasing and reading. The write circuit 102 is a circuit that supplies, to the memory cell array 110, information to be written. The address buffer 103 is a circuit that receives an address for access (write access, erase access, and read access) to the memory cell array 110.

The predecode circuit 104 is a circuit that pre-decodes an address that is output from the address buffer 103. The decoder 105 is a circuit that generates a line selection signal for selecting a word line WL to be accessed in accordance with a line predecode signal that is output from the predecode circuit 104. The WL driver 106 is a circuit that drives the word line WL in accordance with the line predecode signal.

The word line WL is a signal line for selecting one arbitrary line in the memory cell array 110. A bit line BL is a signal line for outputting a memory cell current of a flash memory cell that is connected with the selected word line WL.

The sense amplifier circuit 107 is a circuit that senses the current of the bit line BL and outputs a value that is read from the memory cell array 110, and it includes sense amplifiers SA1 and SA2 and a transistor Tr. The transistor Tr is a switch that switches the connection state with the bit line BL that is input to the sense amplifier SA1 or SA2. Note that, although one pair of bit lines is selected from a plurality of pairs of bit lines by specifying an address and connected to the sense amplifier in an actual configuration, a bit line selection circuit is shown as a switch in a representative manner in FIG. 2 for the sake of simplifying the figure. The sense amplifier control circuit 108 is a control circuit that controls the operation of the sense amplifier circuit 107. Note that the sense amplifier circuit 107 and the sense amplifier control circuit 108 can also be referred to as a determination circuit.

The output driver 109 is a circuit that latches a value that is output from the sense amplifier circuit 107 by a latch circuit L and then outputs the value as a read result to the outside of the flash memory 100.

The memory cell array 110 includes a plurality of flash memory cells, which are rewritable nonvolatile memory cells, whose positions are specified by the word line WL and the bit line BL. The flash memory cells included in the memory cell array 110 are classified into flash memory cells that form a data memory unit 150 and flash memory cells that form a status memory unit 151.

The data memory unit 150 corresponds to the data memory unit 2 in FIG. 1. The data memory unit 150 is a memory cell area that includes a pair of memory cells composed of a memory cell M1$a$ and a memory cell M1$b$. The data memory unit 150 stores 1-bit data by the two memory cells: the memory cell M1$a$ and the memory cell M1$b$. For example, when storing data "0" in the data memory unit 150, the memory cell M1$a$ is set to the high threshold voltage state, and the memory cell M1$b$ is set to the low threshold voltage state, and when storing data "1" in the data memory unit 150, the memory cell M1$a$ is set to the low threshold voltage state, and the memory cell M1$b$ is set to the high threshold voltage state.

In the example shown in FIG. 2, 32 data memory units 150 are placed for each word line WL. Specifically, for each word line WL, 64 memory cells are used as memory cells for the data memory unit 150. Note that those numbers are just an example, and an arbitrary number of data memory units 150 may be placed for each word line WL as a matter of course. In the example shown in FIG. 2, the 32 data memory units 150 store data D31 to D0, respectively. Each of the data D31 to D0 is 1-bit data.

Data stored in the data memory unit 150 is read by the complementary read mode. Therefore, two bit lines BL, i.e., the bit line BL of the memory cell M1$a$ and the bit line BL of the memory cell M1$b$, of the data memory unit 150 are connected to the sense amplifier SA1. Specifically, the both bit lines BL are connected to the sense amplifier SA1 so as to sense a current difference between the memory cell M1$a$ and the memory cell M1$b$. To be more specific, the bit line BL is connected to the input side of the sense amplifier SA1 through the transistor Tr.

The sense amplifier SA1 is a circuit that determines the value of data stored in the data memory unit 150 by comparing a current (memory cell current) flowing through one memory cell M1$a$ of the data memory unit 150 and a current (memory cell current) flowing through the other memory cell M1$b$ of the data memory unit 150. The sense amplifier SA1 outputs the determined data value as a read result to the output driver 109. As a result, the data D31 to D0 are output from the output driver 109.

The status memory unit 151 corresponds to the status memory unit 3 in FIG. 1. In this exemplary embodiment, the status memory unit 151 is a memory cell area that includes four memory cells M2$a$, M2$b$, M2$c$ and M2$d$. The status memory unit 151 stores a status flag and is read by the reference read mode. Note that status flag write control may be performed by an arbitrary control circuit. For example, control may be carried out by the write circuit 102 or by a control circuit such as a flash sequencer. Each of the memory cells M2$a$, M2$b$, M2$c$ and M2$d$ can store 1-bit information. In this exemplary embodiment, the status flag having the same value is stored in each of the memory cells M2$a$, M2$b$, M2$c$ and M2$d$. Specifically, the value of the status flag, which is 1-bit information, is stored in all of the memory cells M2$a$, M2$b$, M2$c$ and M2$d$. Therefore, in this exemplary embodiment, substantially the same status flag is stored in each memory cell of the status memory unit 151.

In this exemplary embodiment, the status flag that is stored in each memory cell of the status memory unit 151 is a flag indicating a data write status of the data memory unit 150. To be more specific, it is a flag indicating whether the data memory unit 150 is in the state where data is written or in the state where data is erased for each of the 32 data memory units 150 connected to the same word line WL. The state where data is written is, in other words, the state where data is stored or data is valid. Likewise, the state where data is erased is, in other words, the state where data is not written or data is invalid.

In this exemplary embodiment, when the data memory unit 150 is in the erased state, the status flag value "1" is stored in each of the memory cells M2$a$, M2$b$, M2$c$ and M2$d$. Thus, each of the memory cells M2$a$, M2$b$, M2$c$ and M2$d$ is set to the low threshold voltage state, for example. On the other hand, when the data memory unit 150 is in the state where data is written, the status flag value "0" is stored in each of the memory cells M2$a$, M2$b$, M2$c$ and M2$d$. Thus, each of the memory cells M2$a$, M2$b$, M2$c$ and M2$d$ is set to the high threshold voltage state, for example.

Although the status memory unit 151 is composed of four memory cells in this exemplary embodiment, this is merely an example, and the status memory unit 151 may be composed of one or more memory cells. Further, although one status memory unit 151 is placed as the status flag indicating the write status of the 32 data memory units 150 connected to the same word line WL in this exemplary embodiment, one status memory unit 151 may be placed for N (N is an integer of one or more) number of data memory units 150.

The status flag that is stored in the status memory unit 151 is read by the reference read mode. Thus, the bit line BL of the status memory unit 151 is connected to the sense amplifier SA2 where the signal line IL through which the reference current Iref can flow is connected to the input side. Specifically, the bit line BL and the signal line IL are connected to the sense amplifier SA2 so as to sense a current difference between the current of the status memory unit 151 and the reference current. To be specific, the bit lines BL of the memory cells M2$a$, M2$b$, M2$c$ and M2$d$ are connected to the sense amplifier SA2 in this exemplary embodiment. Note that, to be more specific, the bit lines BL are connected to the sense amplifier SA2 through the transistor Tr.

The sense amplifier SA2 is a circuit that determines the value of the status flag that is stored in the status memory unit 151 by comparing the sum of currents (memory cell currents) flowing through the memory cells of the status memory unit 151 with the reference current. Specifically, the sense amplifier SA2 determines the value of the status flag by comparing the sum current of the memory cell current of the memory cell M2$a$, the memory cell current of the memory cell M2$b$, the memory cell current of the memory cell M2$c$ and the memory cell current of the memory cell M2$d$ with the reference current. Thus, the signal line IL through which the reference current Iref to be compared with the memory cell current flows is connected to the input side of the sense amplifier SA2. The signal line IL is connected to a constant current source CCS1 that supplies the reference current Iref. The sense amplifier SA2 outputs the determined status flag value as a read result to the output driver 109. The status flag is thereby output from the output driver 109.

As described above, the flash memory 100 can output the data D31 to D0 and the status flag in response to a read request from the outside.

Figure 3:
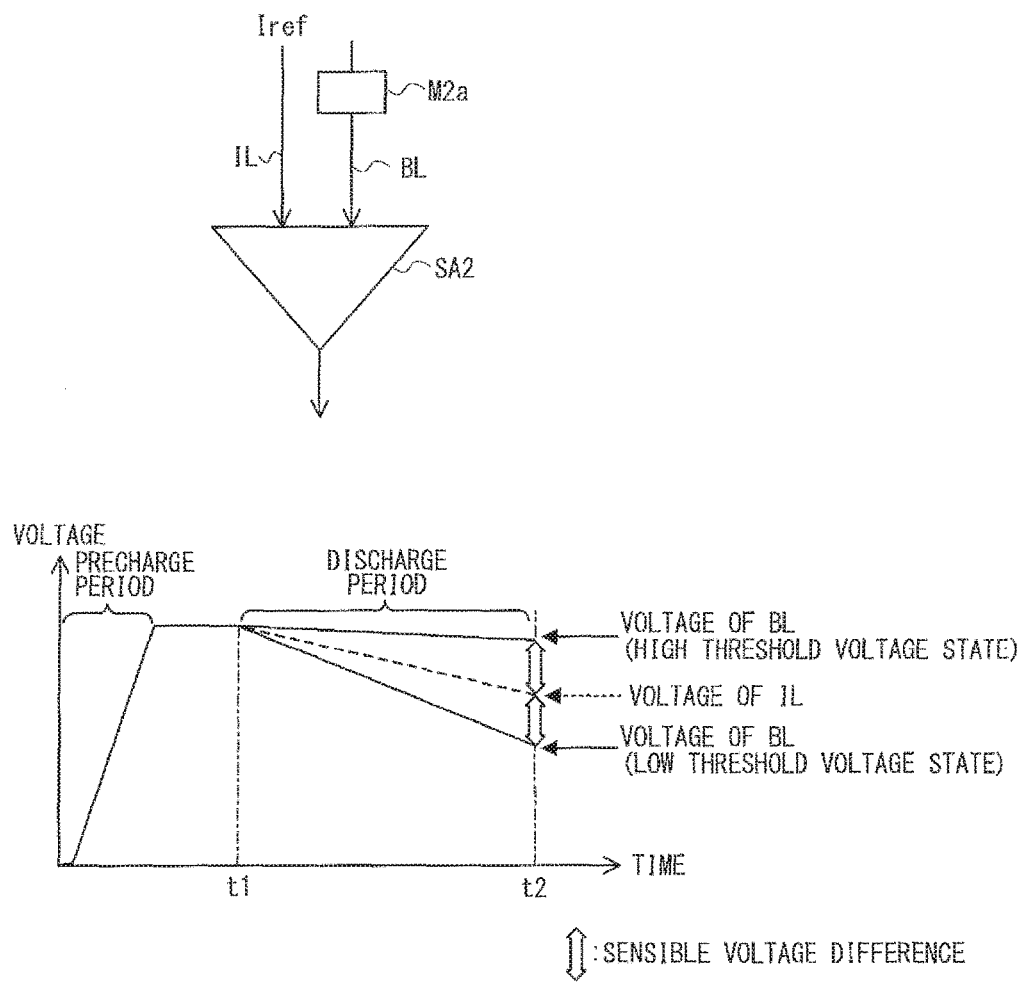
FIG. 3 is a view to explain a sense amplifier that performs reading by a reference read mode, and the upper part shows a schematic view illustrating the input/output relationship of a sense amplifier, and the lower part shows a graph illustrating the temporal transition of a voltage of a signal line that is input to the sense amplifier.

The operation of the sense amplifier SA2 that performs reading by the reference read mode and the operation of the sense amplifier SA1 that performs reading by the complementary read mode are described hereinafter. First, the operation of the sense amplifier SA2 is described. FIG. 3 is a view to explain the sense amplifier SA2 that performs reading by the reference read mode. In FIG. 3, the upper view is a schematic view illustrating the input/output relationship of the sense amplifier SA2, and the lower view is a graph illustrating the temporal transition of a voltage of a signal line that is input to the sense amplifier SA2. Note that FIG. 3 illustrates the case where the status memory unit 151 includes only one memory cell for easier understanding of the effect of a difference in the number of memory cells that constitute the status memory unit 151. Specifically, in the example of FIG. 3, the bit line BL of the memory cell M2*a* and the signal line IL through which the reference current Iref can flow are connected to the input side of the sense amplifier SA2.

As shown in the graph of FIG. 3, in the reference read mode, the bit line BL connected to the memory cell M2*a* and the signal line IL are pre-charged to reach a specified voltage by control of the sense amplifier control circuit 108. After that, at specified discharge start timing t1, discharge of the bit line BL by the memory cell current flowing through the memory cell M2*a* and discharge of the signal line IL by the reference current Iref are carried out by control of the sense amplifier control circuit 108. Then, at specified sense timing t2, the sense amplifier SA2 senses a voltage difference between the voltage of the bit line BL and the voltage of the signal line IL and thereby determines the value stored in the memory cell M2*a*. Note that a voltage drop of the bit line BL during discharge depends on the current value flowing through the bit line BL (the current value of the memory cell current), and the voltage drop increases as the current increases. Further, the current value of the memory cell current depends on the threshold voltage of the memory cell. On the other hand, a voltage drop of the signal line IL during discharge depends on the current value of the reference current flowing through the signal line IL. Therefore, the sense amplifier SA2 compares the memory cell current and the reference current by comparing the voltage of the bit line BL and the voltage of the signal line IL after discharge. The sense amplifier SA2 determines the stored value based on a result of the comparison.

To read a stored value correctly, a difference between the voltage of the signal line IL and the voltage of the bit line BL of the memory cell M2*a* needs to be equal to or more than a sensible voltage difference. To be more specific, in order to correctly read the value of the memory cell M2*a* in the high threshold voltage state, which is "0", for example, a difference between the voltage of the signal line IL and the voltage of the bit line BL of the memory cell M2*a* needs to be equal to or more than a sensible voltage difference at the sense timing t2 as shown in the graph of FIG. 3 (first condition). Likewise, in order to correctly read the value of the memory cell M2*a* in the low threshold voltage state, which is "1", for example, a difference between the voltage of the signal line IL and the voltage of the bit line BL of the memory cell M2*a* needs to be equal to or more than a sensible voltage difference at the sense timing t2 as shown in the graph of FIG. 3 (second condition). Because it is required to correctly read both of the value of the memory cell M2*a* where the data write status is in the high threshold voltage state and the value of the memory cell M2*a* where it is in the low threshold voltage state, both of the first condition and the second condition need to be satisfied.

Figure 4:
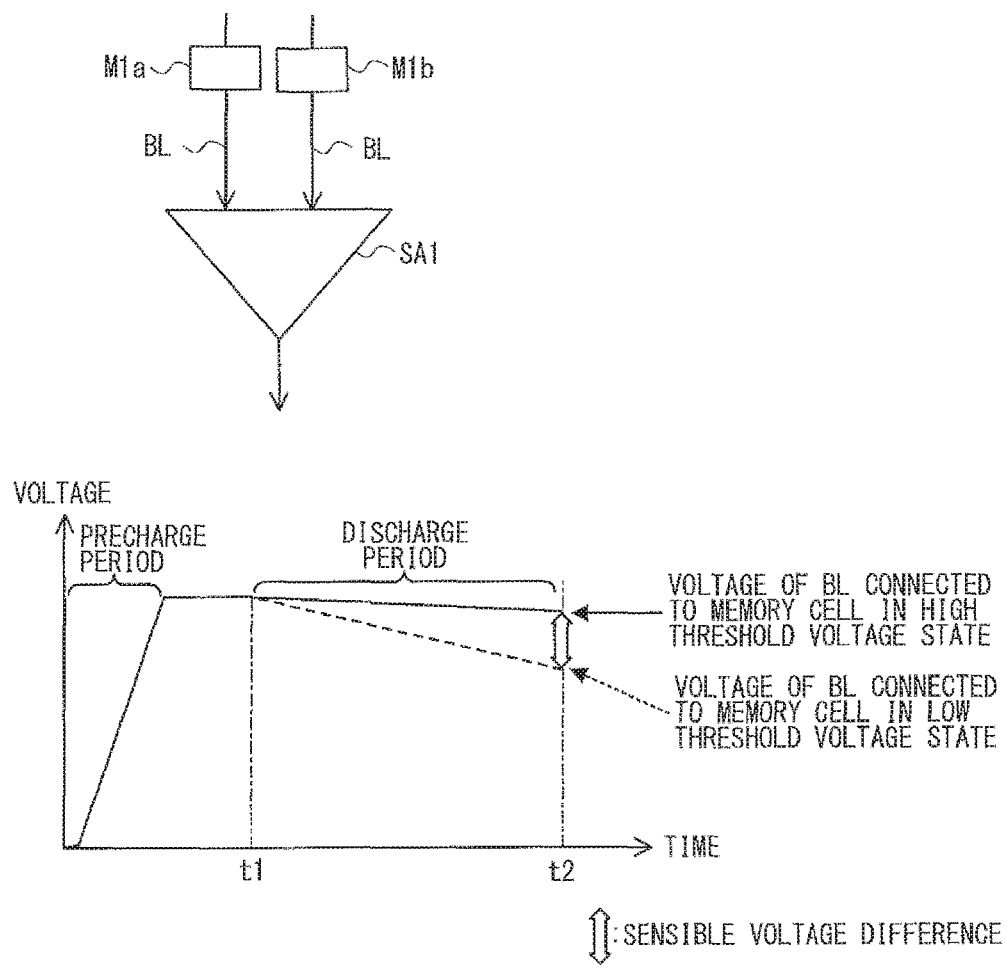
FIG. 4 is a view to explain a sense amplifier that performs reading by a complementary read mode, and the upper part shows a schematic view illustrating the input/output relationship of a sense amplifier, and the lower part shows a graph illustrating the temporal transition of a voltage of a signal line that is input to the sense amplifier.

Next, the operation of the sense amplifier SA1 is described hereinafter. FIG. 4 is a view to explain the sense amplifier SA1 that performs reading by the complementary read mode. In FIG. 4, the upper view is a schematic view illustrating the input/output relationship of the sense amplifier SA1, and the lower view is a graph illustrating the temporal transition of a voltage of a signal line that is input to the sense amplifier SA1.

As shown in the graph of FIG. 4, in the complementary read mode, the bit line BL connected to the memory cell M1*a* and the bit line BL connected to the memory cell M1*b* are pre-charged to reach a specified voltage by control of the sense amplifier control circuit 108. After that, at specified discharge start timing t1, discharge of the bit line BL by the memory cell current flowing through the memory cell M1*a* and discharge of the bit line BL by the memory cell current flowing through the memory cell M1*b* are carried out by control of the sense amplifier control circuit 108. Then, at specified sense timing t2, the sense amplifier SA1 senses a voltage difference between the both bit lines BL and thereby determines the value stored in the data memory unit 150. In this manner, the sense amplifier SA1 compares the memory cell currents of the memory cells M1*a* and M1*b* by comparing the voltages of the both bit lines BL after discharge. The sense amplifier SA1 determines the stored value based on a result of the comparison.

In the state where a value is stored in the memory cell in the complementary read mode, one memory cell of the memory cells M1*a* and M1*b* is in the high threshold voltage state, and the other memory cell is in the low threshold voltage state. Thus, to correctly read the stored value in the complementary read mode, it is only necessary that a difference between the voltage of the bit line BL of the memory cell in the high threshold voltage state and the voltage of the bit line BL of the memory cell in the low threshold voltage state is equal to or more than a sensible voltage difference. Therefore, a difference between the voltage of the bit line BL when the memory cell is in the high threshold voltage state and the voltage of the bit line BL when the memory cell is in the low threshold voltage state can be smaller than that in the reference read mode.

Figure 5:
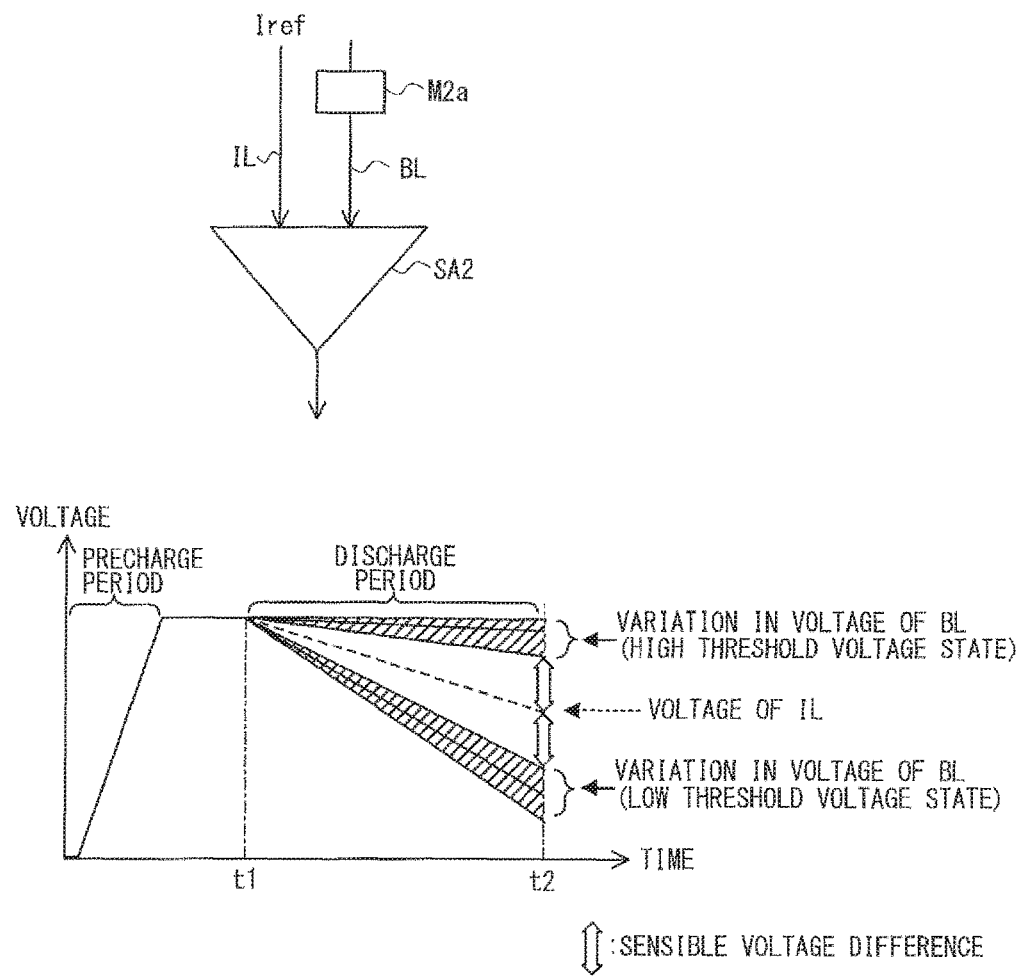
FIG. 5 is a view to explain the effect of variation in the amount of current in a sense amplifier that performs reading by a reference read mode, and the upper part shows a schematic view illustrating the input/output relationship of a sense amplifier, and the lower part shows a graph illustrating the temporal transition of a voltage of a signal line that is input to the sense amplifier.

A difference between the reference read mode and the complementary read mode when focusing on variation in memory cell current caused by temperature conditions and voltage conditions is described hereinafter. The amount of current in the memory cell tends to vary depending on temperature conditions and voltage conditions. FIG. 5 is a view to explain the effect of variation in the amount of current in the sense amplifier SA2 that performs reading by the reference read mode. In FIG. 5, the upper view is a schematic view illustrating the input/output relationship of the sense amplifier SA2, and the lower view is a graph illustrating the temporal transition of the voltage of the signal line that is input to the sense amplifier SA2. Note that FIG. 5, just like FIG. 3, illustrates the case where the status memory unit 151 includes only one memory cell.

In the reference read mode, it is necessary to satisfy both of the first condition and the second condition as described above. Therefore, a difference between the lower limit of variation in the voltage of the bit line BL when the memory cell M2a is in the high threshold voltage state and the voltage of the signal line IL needs to be equal to or more than a sensible voltage difference, and a difference between the upper limit of variation in the voltage of the bit line BL when the memory cell M2a is in the low threshold voltage state and the voltage of the signal line IL needs to be equal to or more than a sensible voltage difference. Thus, in the reference read mode, a larger voltage difference is required when taking variation in memory cell current into consideration compared with when not taking it into consideration.

Figure 6:
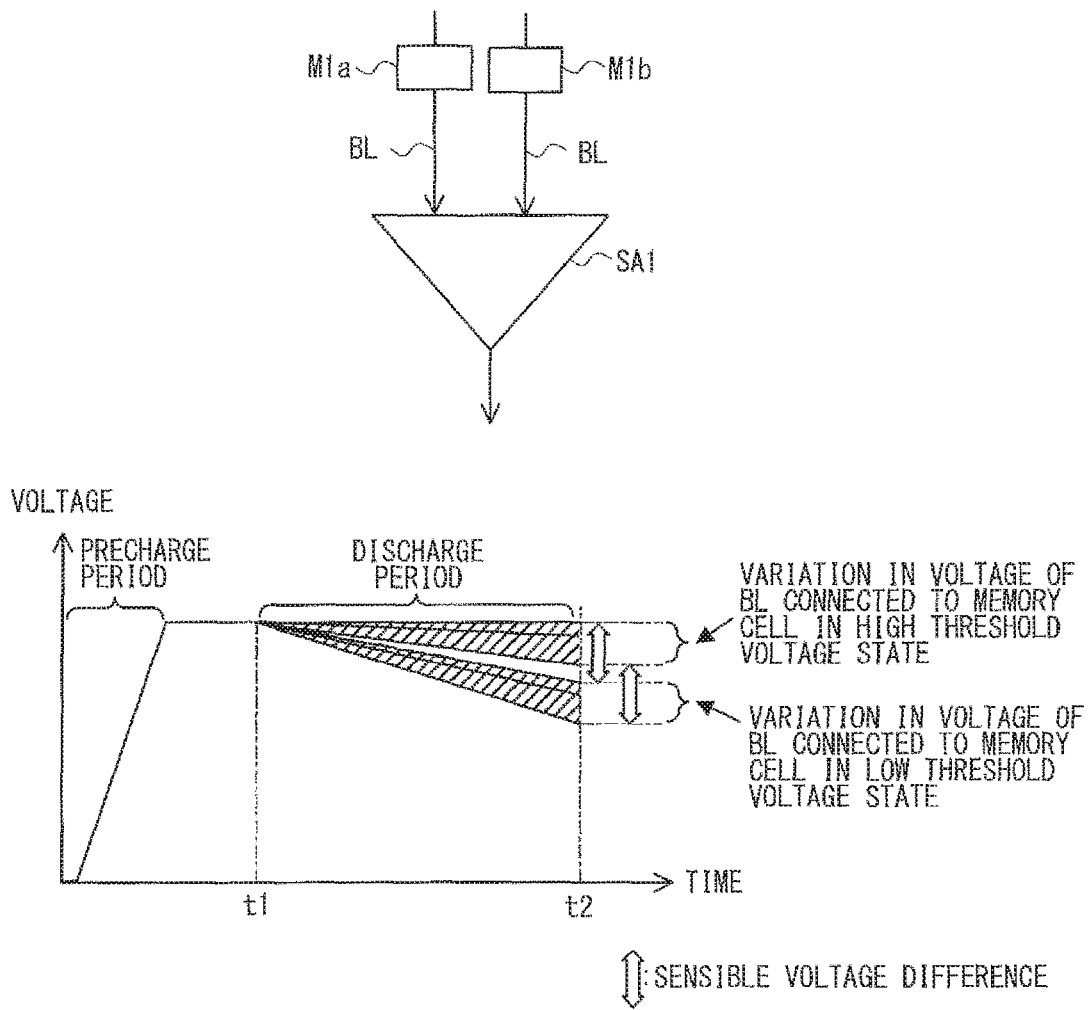
FIG. 6 is a view to explain the effect of variation in the amount of current in a sense amplifier that performs reading by a complementary read mode, and the upper part shows a schematic view illustrating the input/output relationship of a sense amplifier, and the lower part shows a graph illustrating the temporal transition of a voltage of a signal line that is input to the sense amplifier.

FIG. 6 is a view to explain the effect of variation in the amount of current in the sense amplifier SA1 that performs reading by the complementary read mode. In FIG. 6, the upper view is a schematic view illustrating the input/output relationship of the sense amplifier SA1, and the lower view is a graph illustrating the temporal transition of the voltage of the signal line that is input to the sense amplifier SA1. Variation in memory cell current that depends on temperature conditions and voltage conditions has the same characteristics for the memory cell in the high threshold voltage state and the memory cell in the low threshold voltage state. Specifically, at the sense timing t2, when the voltage of the bit line BL of the memory cell Mia is affected by variation, the voltage of the bit line BL of the memory cell M1b is also affected in the same way. Thus, in the complementary read mode, data can be read correctly if a voltage difference between the upper limit of variation in the voltage of the bit line BL of the memory cell in the high threshold voltage state and the upper limit of variation in the voltage of the bit line BL of the memory cell in the low threshold voltage state or a voltage difference between the lower limit of variation in the voltage of the bit line BL of the memory cell in the high threshold voltage state and the lower limit of variation in the voltage of the bit line BL of the memory cell in the low threshold voltage state is equal to or more than a sensible voltage difference. Thus, in the complementary read mode, there is no effect of variation in memory cell current by temperature conditions and voltage conditions due to such principles.

As described above, when taking variation into account, it is possible to further reduce a difference between the voltage of the bit line BL when the memory cell is in the high threshold voltage state and the voltage of the bit line BL when the memory cell is in the low threshold voltage state in the complementary read mode compared with the difference in the reference read mode. The fact that it is possible to reduce a voltage difference between the voltage of the bit line BL in the high threshold voltage state and the voltage of the bit line BL in the low threshold voltage state means that it is possible to reduce a difference between the threshold voltage in the high threshold voltage state and the threshold voltage in the low threshold voltage state. Therefore, in general, it is possible in the complementary read mode to read data correctly even when a difference in threshold voltage between the memory cell that is set to the high threshold voltage state and the memory cell that is set to the low threshold voltage state decreases with an increase in the number of times of writing and the number of times of erasing or with an increase in the data retention period. Thus, in general, the complementary read mode has better data retention properties than the reference read mode.

Although the complementary read mode has such an advantage, a read result after erasure is undefined as described earlier. On the other hand, in the reference read mode, a value after erasure can be defined because it is read by comparison using a reference current. This is because the voltage of the bit line BL of the memory cell that is set to the high threshold voltage state by erasure is lower than the voltage of the signal line IL. The flash memory 100 according to this exemplary embodiment includes the data memory unit 150 that is read by the complementary read mode and the status memory unit 151 that is read by the reference read mode. It is thereby possible in the flash memory 100 to uniquely define the value of the status flag after erasure and to store data by the complementary read mode.

It is preferred that the status memory unit 151 that is read by the reference read mode can achieve equal retention properties to the complementary read mode. Equal retention properties to the complementary read mode can be achieved by increasing a difference between the voltage of the bit line BL of the memory cell that constitutes the status memory unit 151 and the voltage of the signal line IL at the sense timing. This can be achieved by connecting a plurality of memory cells having the same value to the bit line BL to obtains a larger memory cell current. Therefore, in the flash memory 100 according to this exemplary embodiment, the status memory unit 151 includes a plurality of flash memory cells in which the status value of the same value is stored.

Figure 7:
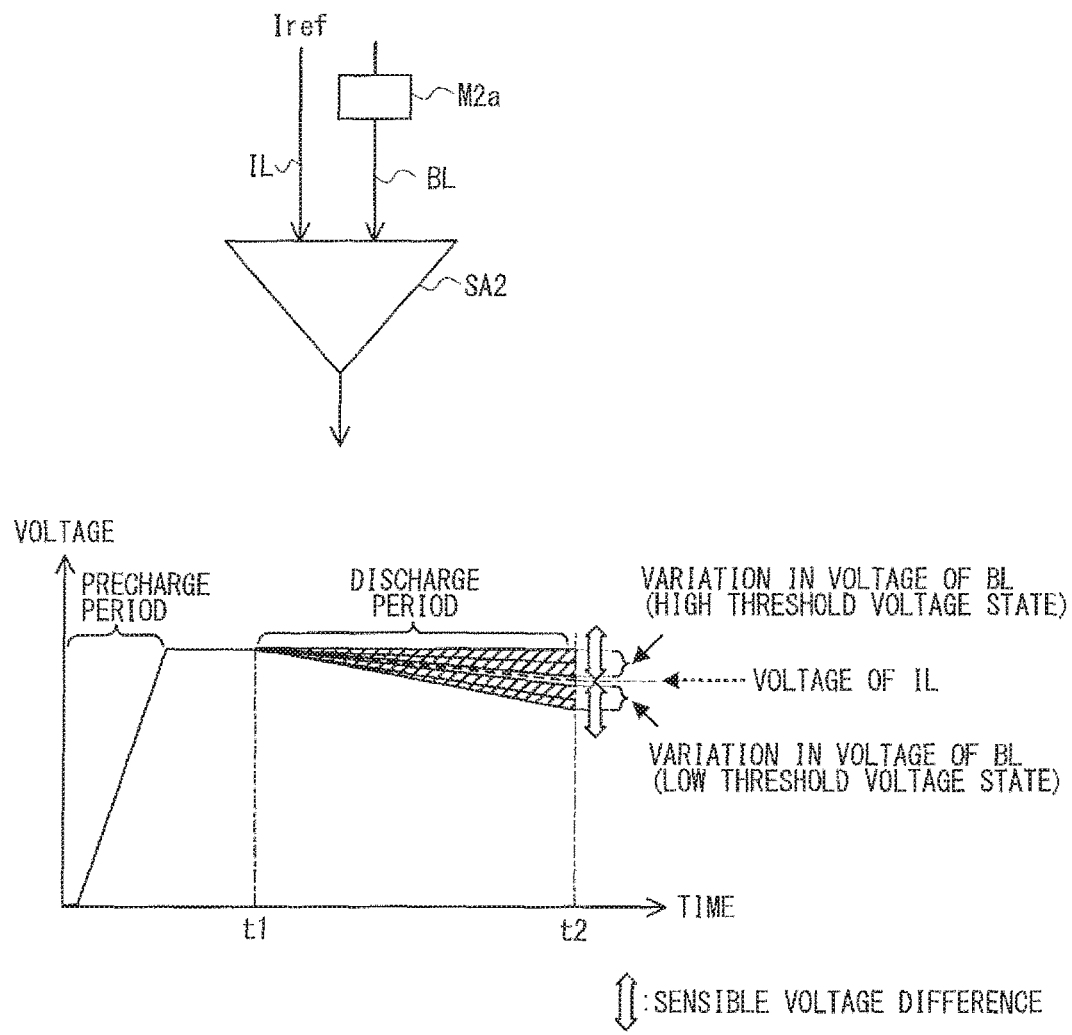
FIG. 7 is a view to explain a sense amplifier in the case of retaining a value in one memory cell by a reference read mode, and the upper part shows a schematic view illustrating the input/output relationship of a sense amplifier, and the lower part shows a graph illustrating the temporal transition of a voltage of a signal line that is input to the sense amplifier.

A difference between the case where one memory cell M2a retains a value and four memory cells M2a to M2d retain the same value in the reference read mode is described as an example. FIG. 7 is a view to explain the sense amplifier SA2 in the case of retaining a value in one memory cell M2a by the reference read mode. In FIG. 7, the upper view is a schematic view illustrating the input/output relationship of the sense amplifier SA2, and the lower view is a graph illustrating the temporal transition of the voltage of the signal line that is input to the sense amplifier SA2. Note that the graph takes variation in memory cell current into consideration. In the example shown in FIG. 7, a voltage difference that is required for sensing is not achieved at the sense timing t2.

Figure 8:
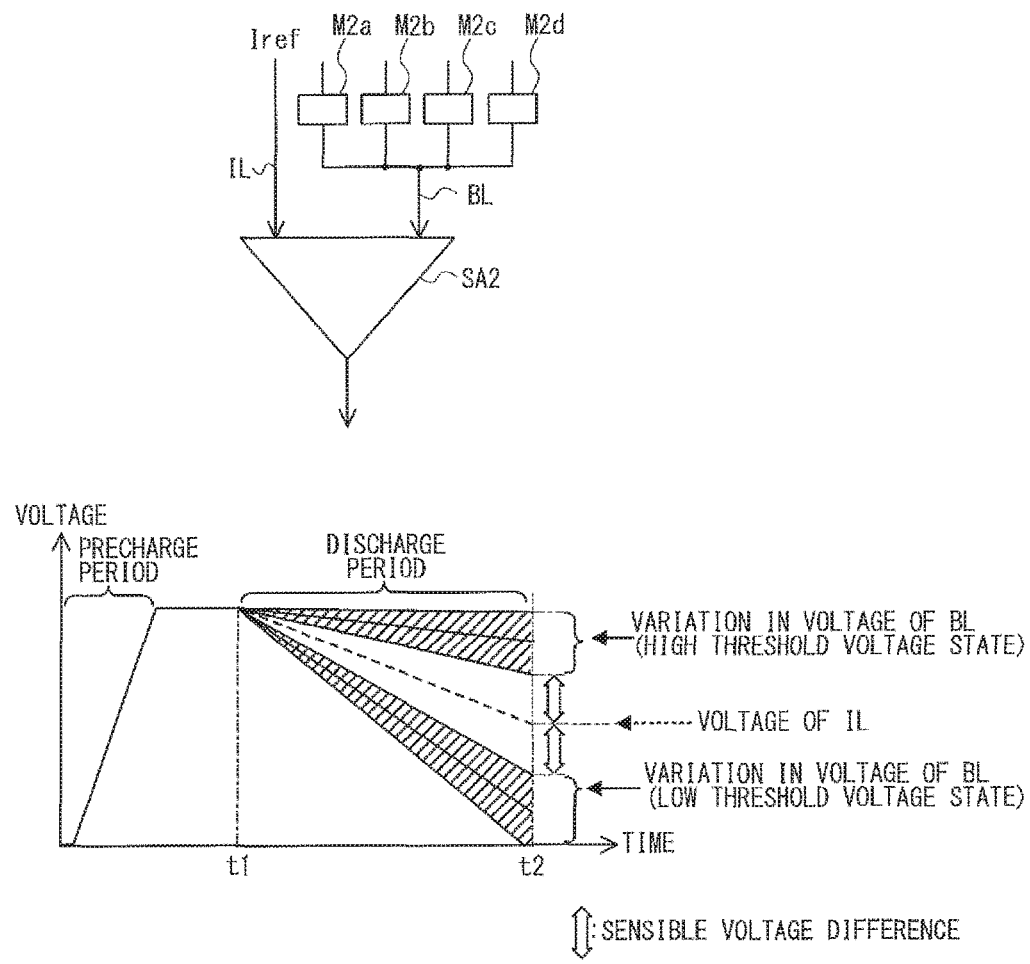
FIG. 8 is a view to explain a sense amplifier in the case of retaining the same value in four memory cells by a reference read mode, and the upper part shows a schematic view illustrating the input/output relationship of a sense amplifier, and the lower part shows a graph illustrating the temporal transition of a voltage of a signal line that is input to the sense amplifier.

FIG. 8 is a view to explain the sense amplifier SA2 in the case of retaining the same value in four memory cells M2a to M2d by the reference read mode. In FIG. 8, the upper view is a schematic view illustrating the input/output relationship of the sense amplifier SA2, and the lower view is a graph illustrating the temporal transition of the voltage of the signal line that is input to the sense amplifier SA2. Note that the graph takes variation in memory cell current into consideration. By connecting the four memory cells in parallel to the sense amplifier SA2, it is possible to increase a difference between the voltage of the bit line BL in the high threshold voltage state and the voltage of the bit line BL in the low threshold voltage state. Note that, in the graph of FIG. 8, the current value of the reference current is set so that the voltage of the signal line IL is a voltage between the voltage of the bit line BL in the high threshold voltage state and the voltage of the bit line BL in the low threshold voltage state.

Therefore, both a difference between the lower limit of variation in the voltage of the bit line BL of the memory cells M2a to M2d in the high threshold voltage state and the voltage of the signal line IL and a difference between the upper limit of variation in the voltage of the bit line BL of the memory cells M2a to M2d in the low threshold voltage state and the voltage of the signal line IL can be equal to or more than a voltage difference that is required for sensing. It is thereby possible to read the value correctly. In this manner, because the status memory unit 151 that is read by the reference read mode includes a plurality of flash memory cells in this exemplary embodiment, it is possible to improve the retention properties compared with the case where the status memory unit 151 includes only one flash memory. Note that, although four memory cells are used as one set for the status memory unit 151 as an example in this exemplary embodiment, this number is merely an example. The number may be determined on the basis of experiment, simulation or the like so as to generate a sufficient voltage difference even with the number of times of writing and the number of times of erasing or after the retention period which are the same as those of the data memory unit 150 in the complementary read mode.

Therefore, in the flash memory 100 according to this exemplary embodiment, the status memory unit 151 is read as follows. First, by control of the sense amplifier control circuit 108, the bit lines BL connected respectively to the memory cells M2a to M2d and the signal line IL are pre-charged to reach a specified voltage. After that, at the specified discharge start timing t1, discharge of the bit line BL by the sum current of the currents flowing through the memory cells M2a to M2d and discharge of the signal line IL by the reference current Iref are carried out by control of the sense amplifier control circuit 108. Then, at the specified sense timing t2, the sense amplifier SA2 determines the value stored in the status memory unit 151 by comparing the voltage of the bit line BL and the voltage of the signal line IL after discharge. In other words, the sense amplifier SA2 achieves comparison between the sum current and the reference current by comparing the voltage of the bit line BL and the voltage of the signal line IL after discharge and thereby determines the value.

In the flash memory 100 according to this exemplary embodiment, the data memory unit 150 and the status memory unit 151 on the same word line WL are preferably erased at the same time. This is because, when the data memory unit 150 is in the erased state, it is guaranteed to obtain the status flag value indicating the erased state as a read result of the status memory unit 151. Further, the flash memory 100 according to this exemplary embodiment is configured so that writing of the status memory unit 151 is carried out separately from writing of the data memory unit 150 on the same word line WL as the status memory unit 151. Thus, by performing writing to the status memory unit 151 after writing to the data memory unit 150, it is guaranteed that valid data is stored in the data memory unit 150 when a value indicating the state where data is written in the data memory unit 150 is obtained as a read result of the status flag value. Note that the data memory unit 150 and the status memory unit 151 on the same word line WL may be erased independently of one another, or writing may be carried out simultaneously with each other. This may be selected as appropriate based on a status which the status flag is used to indicate.

The flash memory 100 according to the first exemplary embodiment is described above. The flash memory 100 includes the status memory unit 3 that is read by the reference read mode. Thus, a read result of the status flag after erasing is defined uniquely. Further, in this exemplary embodiment, the status flag is a flag indicating the data write status of the data memory unit 150. Therefore, even after erasing, the flash memory 100 can accurately determine whether the data memory unit 150 is in the state where data is written or in the state where data is erased.

Further, the status memory unit 151 that is read by the reference read mode includes a plurality of flash memory cells where the status value of the same value is stored. It is thereby possible to improve the retention properties of the status memory unit 151 that is read by the reference read mode.

Furthermore, according to the flash memory 100, it is possible to create a flash memory having good retention properties at low costs. To describe this point, assume the case of reading 32-bit data by the reference read mode, which is different from the flash memory 100 according to this exemplary embodiment. It is assumed that, in the reference read mode, equal retention properties to the complementary read mode are obtained by using four memory cells. In this case, twice the number of memory cells are required compared with the case of implementing the data memory unit 150 in the complementary read mode. Specifically, in this case, 128 (=32×4) memory cells for the data memory unit 150 are required. On the other hand, the flash memory 100 according to this exemplary embodiment can be implemented with total 68 memory cells, which is the sum of 64 (=32×2) memory cells for the data memory unit 150 and 4 memory cells for the status memory unit 151. It is thus possible to obtain good retention properties with a smaller number of memory cells.

<Second Exemplary Embodiment>

Figure 9:
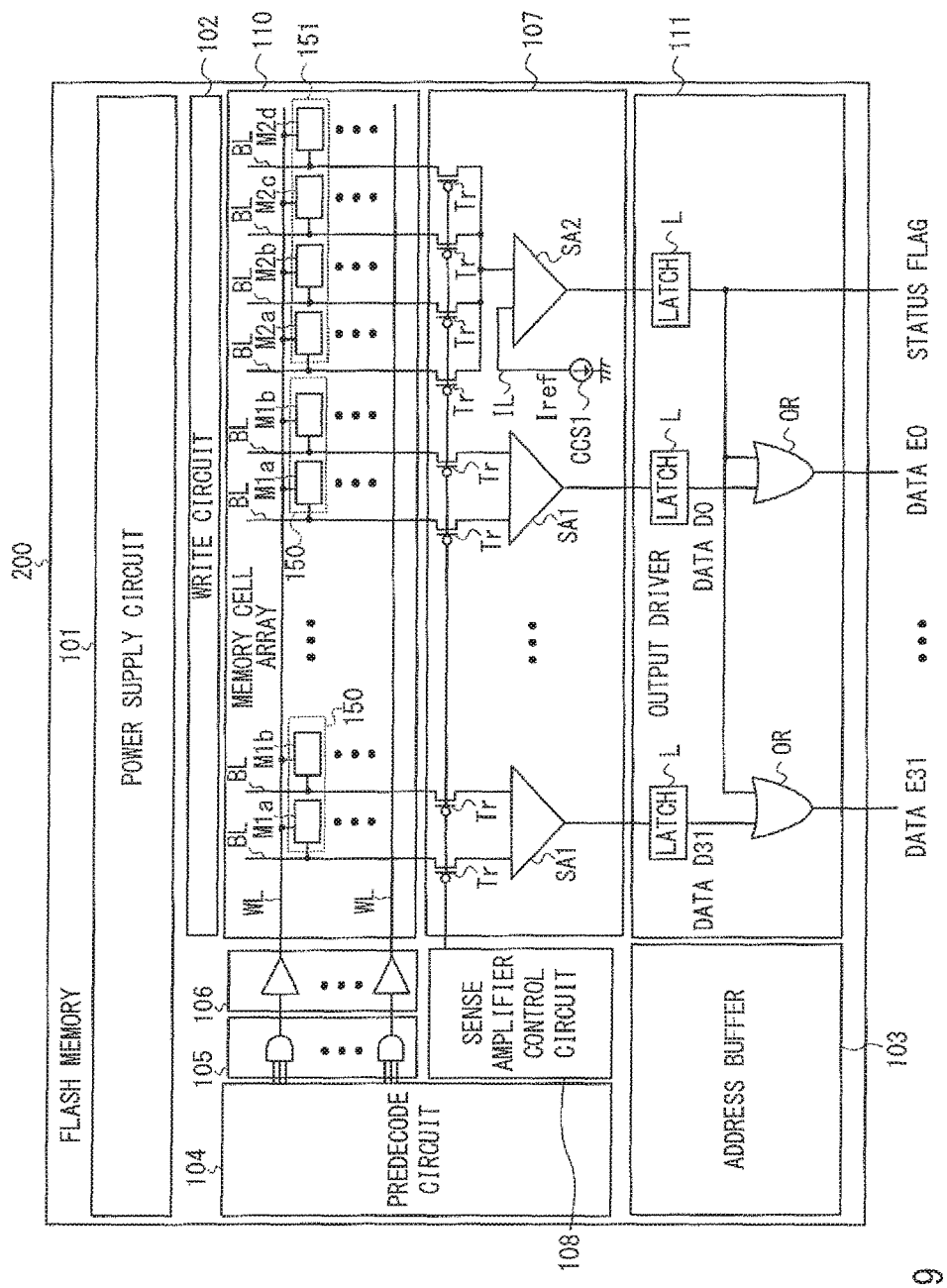
FIG. 9 is a block diagram showing a configuration example of a flash memory according to a second exemplary embodiment.

A second exemplary embodiment is described hereinbelow. FIG. 9 is a block diagram showing a configuration example of a flash memory 200 according to the second exemplary embodiment. The flash memory 200 is different from the flash memory 100 according to the first exemplary embodiment in that the output driver 109 is replaced by an output driver 111. Note that, in this exemplary embodiment, it is assumed that erasing is carried out simultaneously and also writing is carried out simultaneously in the data memory unit 150 and the status memory unit 151 on the same word line WL.

The output driver 111 is different from the output driver 109 in that a logical sum circuit OR that carries out the logical OR between a read value from the data memory unit 150 and a read value from the status memory unit 151 is added. In this configuration, the output driver 111 can carry out the logical OR between a read value from the data memory unit 150 and a read value from the status memory unit 151 and outputs a result as a read result of the data memory unit 150. Specifically, the logical OR between the data D31 to D0 read by the sense amplifier SA1 and the status flag is carried out. Then, data E31 to E0, which is a result of the logical OR operation, is output as a read result of the data memory unit 150. Note that the output drive 111 can be also referred to as an output unit (output circuit).

Because the data memory unit 150 is read by the complementary read mode, a read value in the erased state is undefined. On the other hand, because the status memory unit 151 is read by the reference read mode, a read value of the status memory unit 151 where erasing is carried out together with erasing of the data memory unit 150 is "1". Thus, when the data memory unit 150 is in the erased state, the values of data E31 to E0 that are obtained as a read result after the logical operation are all "1". On the other hand, when data is written in the data memory unit 150, a read value of the status memory unit 151 where writing is carried out together with writing to the data memory unit 150 is "0". Accordingly, when data is written in the data memory unit 150, the values of data E31 to E0 that are obtained as a read result after the logical operation are the same as the values of data D31 to D0.

Algorithms or software developed for reference read flash memory often determine the status of data based on the assumption that a data read result when a memory cell is in the erased state is fixed to "1". In the flash memory 200 according to this exemplary embodiment, the logical OR between a read value from the data memory unit 150 and a status flag is output as a read result of the data memory unit 150. Thus, as a read result of the memory cell in the erased state, the same result as in the flash memory where reading is done only in the reference read mode can be obtained. Therefore, according to this exemplary embodiment, it is possible to use algorithms or software developed for reference read flash memory also for the flash memory 200, which is a flash memory including the complementary read mode.

<Third Exemplary Embodiment>

Figure 10:
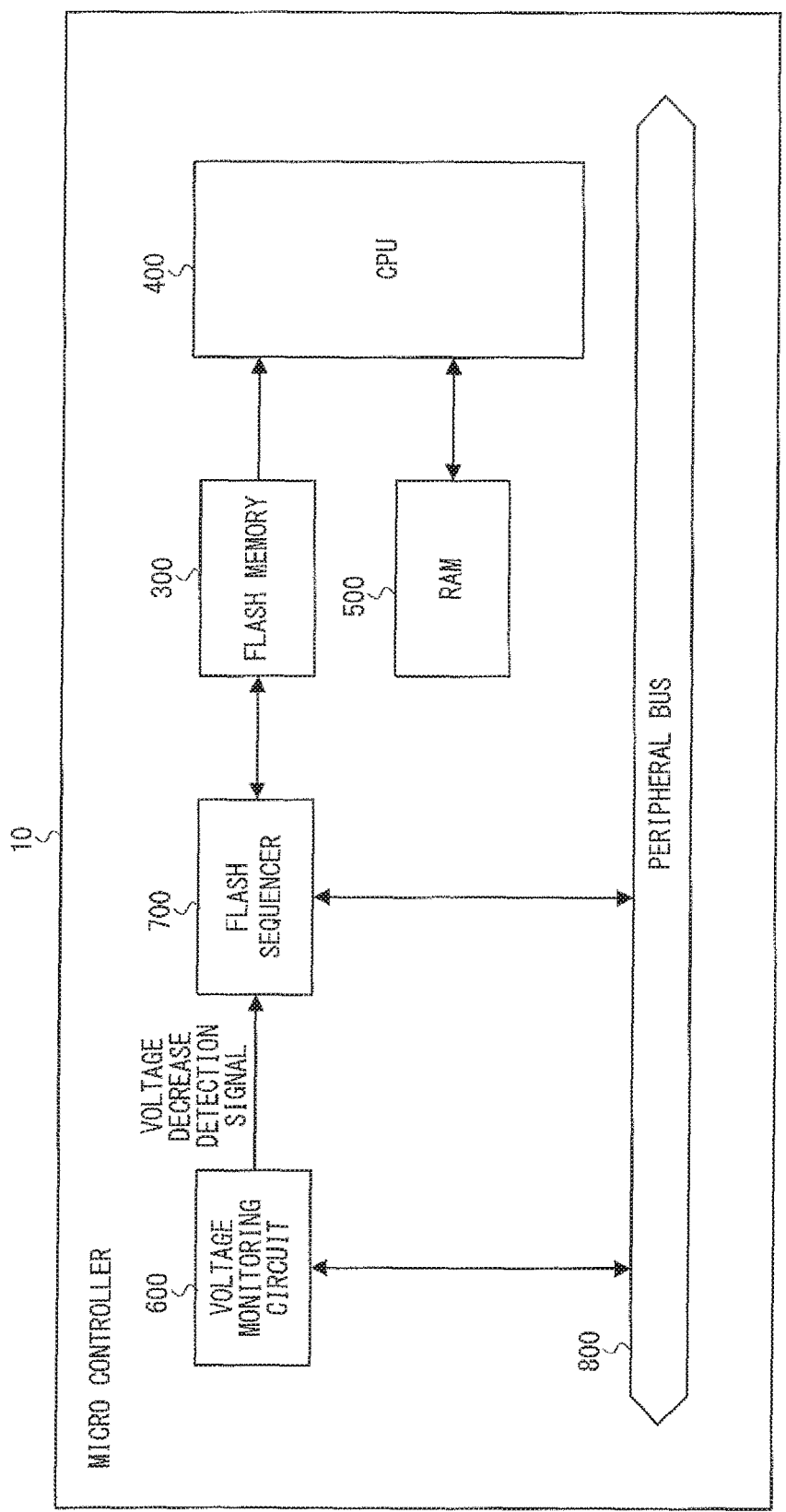
FIG. 10 is a block diagram showing a configuration example of a micro controller on which a flash memory according to a third exemplary embodiment is mounted.

A third exemplary embodiment is described hereinbelow. The third exemplary embodiment is different from the second exemplary embodiment in that an interrupt detection flag indicating that writing to the data memory unit 150 has been interrupted due to an error or the like can be stored in a flash memory. FIG. 10 is a block diagram showing a configuration example of a micro controller 10 on which a flash memory 300 according to the third exemplary embodiment is mounted. The micro controller 10 can be also referred to as a storage device.

As shown in FIG. 10, the micro controller 10 includes a CPU (Central Processing Unit) 400, a RAM (Random Access Memory) 500, a flash memory 300, a voltage monitoring circuit 600, a flash sequencer 700, and a peripheral bus 800. The peripheral bus 800 is a bus to which the CPU 400, the voltage monitoring circuit 600 and the flash sequencer 700 are connected.

The CPU 400 executes processing based on a program (software) and data stored in the flash memory 300 or the RAM 500. Note that, when reading of the flash memory 300 cannot be executed due to during writing or erasing of the flash memory 300 or the like, the CPU 400 can continue processing based on the program by copying the program from the flash memory 300 to the RAM 500 in advance. The RAM 500 is a volatile memory in which data or the like to be used by the CPU 400 is stored. The flash memory 300 is substantially the same as the flash memory 200 according to the second exemplary embodiment, and it is different in having a memory area to store the interrupt detection flag. The details of the flash memory 300 are described later.

The voltage monitoring circuit 600 is a circuit that monitors a power supply voltage supplied to the micro controller 10. The voltage monitoring circuit 600 can be also referred to as a voltage detection unit (voltage detection circuit). Note that the power supply voltage supplied to the micro controller 10 is a voltage of a power supply that is needed for the elements of the micro controller 10 to operate, and it includes a power supply voltage supplied to the flash memory 300, for example. The voltage monitoring circuit 600 detects that the power supply voltage becomes equal to or lower than a specified value. When the voltage monitoring circuit 600 detects that the power supply voltage becomes equal to or lower than a specified value, it outputs a voltage decrease detection signal to the flash sequencer 700. In the following description, this specified value is referred to as a voltage decrease detection level. Note that, in this exemplary embodiment, the voltage monitoring circuit 600 includes a storage unit (e.g., register) for storing the above-described voltage decrease detection level that is used to determine whether or not to output the voltage decrease detection signal, and the voltage decrease detection level can be changed by rewriting the content of the storage unit. It is thereby possible to flexibly change a threshold for determining the output of the voltage decrease detection signal.

To be specific, to make the change, the CPU 400 can rewrite the stored content of the storage unit of the voltage monitoring circuit 600 connected to the peripheral bus 800. Note that the voltage monitoring circuit 600 may include a storage unit that stores a set value for determining a voltage monitoring target.

In this exemplary embodiment, writing and erasing of the flash memory 300 by the CPU 400 are performed through the flash sequencer 700. Note that data reading from the flash memory 300 by the CPU 400 may be performed through the flash sequencer 700 or may be performed directly without through the flash sequencer 700.

The flash sequencer 700 is a circuit that controls writing, erasing or the like of the flash memory 300. The flash sequencer 700 can be also referred to as a control unit (control circuit). The flash sequencer 700 includes an address specification register to store address data for specifying an address of the flash memory 300 where writing or erasing is to be carried out. In the address specification register, address data transmitted from the CPU 400 is stored. Further, the flash sequencer 700 includes a command specification register to store a command indicating writing, erasing or the like. In the command specification register, command data transmitted from the CPU 400 is stored.

The CPU 400 writes command data to the flash sequencer 700 in a predetermined sequence and thereby specifies the details of control to be performed by the flash sequencer 700. The flash sequencer 700 performs control corresponding to a series of command data written to the command specification register on the address in the flash memory 300 which is indicated by the address data written to the address specification register.

Commands of the flash sequencer 700 are described with reference to FIG. 11 as a specific example. As shown in FIG. 11, a data write command and a data erase command are prepared as the commands to control the flash sequencer 700.

In the case of writing data to the flash memory 300, the CPU 400 writes address data to the address specification register through the peripheral bus 800 and thereby specifies the address in the flash memory 300 to which data is to be written. Then, the CPU 400 writes command data indicating write commands sequentially to the command specification register. To be more specific, when writing 4-byte data to the flash memory 300, the CPU 400 writes the command data H'E8, H'02, 4-byte data (2-byte data×2) and H'D0 sequentially to the command specification register as shown in FIG. 11. Further, when writing 16-byte data to the flash memory 300, the CPU 400 writes the command data H'E8, H'08, 16-byte data (2-byte data×8) and H'D0 sequentially to the command specification register as shown in FIG. 11. Note that "H'" means that the following numerical value is in hexadecimal notation.

In response thereto, the flash sequencer 700 writes the data written in the command specification register to the address in the flash memory 300 which is indicated by the address data written in the address specification register. Specifically, when H'02 is written in the second writing, the flash sequencer 700 writes 4-byte data written in the third to fourth writing to the 4-byte area starting from the address specified by the address data. On the other hand, when H'08 is written in the second writing, the flash sequencer 700 writes 16-byte data written in the third to tenth writing to the 16-byte area starting from the address specified by the address data.

In the case of erasing data in the flash memory 300, the CPU 400 writes address data to the address specification register through the peripheral bus 800 and thereby specifies the address of a block in the flash memory 300 from which data is to be erased. Then, the CPU 400 writes command data indicating data erase commands sequentially to the command specification register. To be more specific, the CPU 400 writes the command data H'20 and H'D0 sequentially to the command specification register. In response thereto, the flash sequencer 700 erases the data of the block in the address in the flash memory 300 which is indicated by the address data written in the address specification register.

Figure 12:
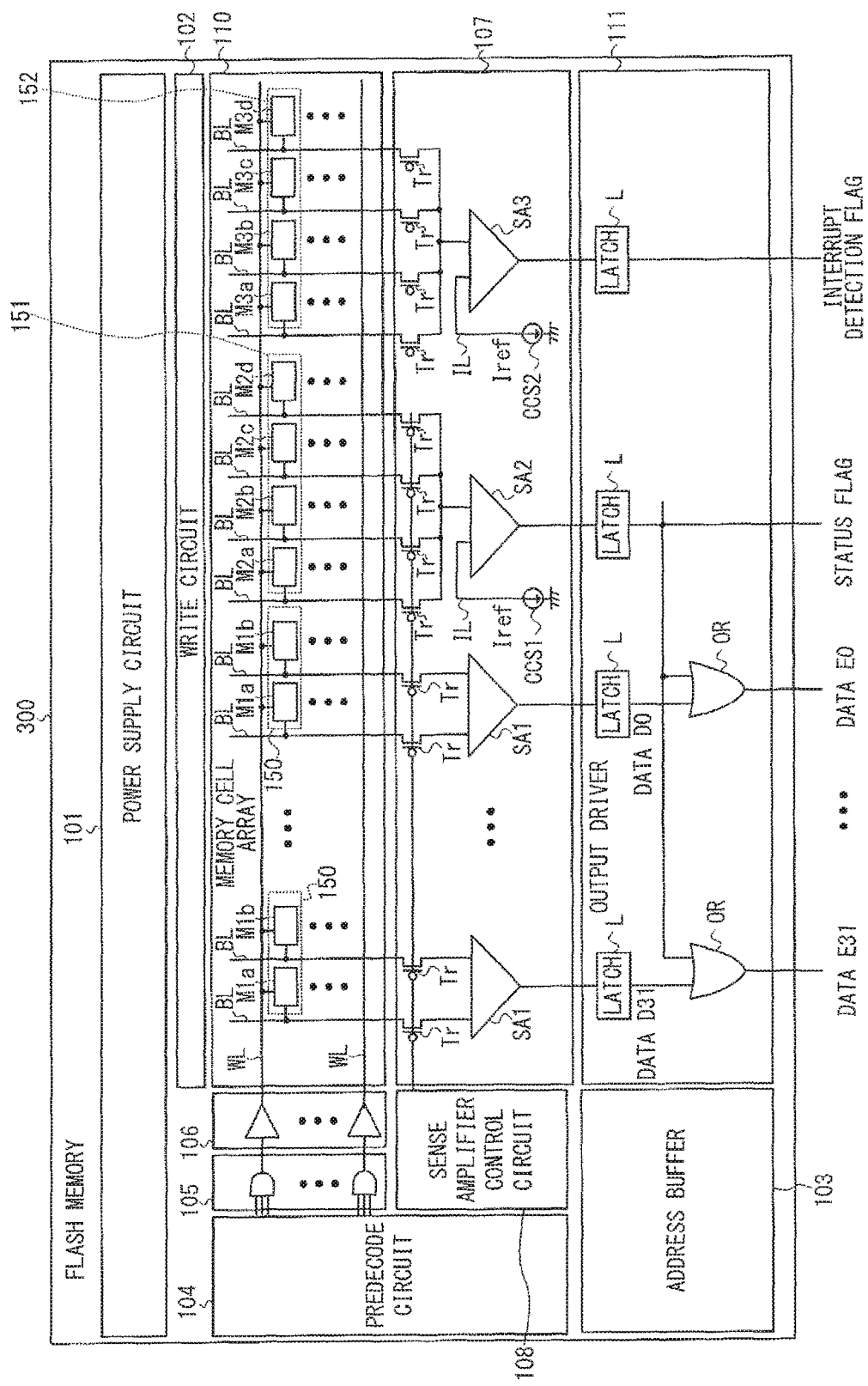
FIG. 12 is a block diagram showing a configuration example of the a flash memory according to the third exemplary embodiment.

The flash memory 300 according to this exemplary embodiment is described hereinbelow. FIG. 12 is a block diagram showing a configuration example of the flash memory 300 according to the third exemplary embodiment. The flash memory 300 is different from the flash memory 200 according to the second exemplary embodiment in that the memory cell array 110 includes an interrupt detection memory unit (interrupt detection memory circuit) 152. Thus, in the flash memory 300, the configurations and operations of the data memory unit 150 and the status memory unit 151 are the same as those of the flash memory 200 according to the second exemplary embodiment. The configurations and operations different from those in the second exemplary embodiment are described hereinbelow. Note that it is assumed in this exemplary embodiment that the interrupt detection memory unit 152 is erased simultaneously with the data memory unit 150 and the status memory unit 151 on the same word line WL as an example. It is also assumed that the interrupt detection memory unit 152 can execute writing at different timing from the data memory unit 150 and the status memory unit 151 on the same word line WL.

The flash memory cells included in the memory cell array 110 according to this exemplary embodiment are classified into flash memory cells that form the data memory unit 150, flash memory cells that form the status memory unit 151, and flash memory cells that form the interrupt detection memory unit 152.

In this exemplary embodiment, the interrupt detection memory unit 152 is a memory cell area that includes four memory cells M3a, M3b, M3c and M3d. Although the interrupt detection memory unit 152 is different from the status memory unit 151 in that it stores the interrupt detection flag, it has the same configuration as the status memory unit 151. Thus, the interrupt detection memory unit 152 includes flash memory cells that are read by the reference read mode. By those flash memory cells, the interrupt detection flag indicating whether there is an interruption of writing or not is stored.

Because the interrupt detection memory unit 152 is a memory cell that is read by the reference read mode, each of the memory cells M3a, M3b, M3c and M3d can store 1-bit information. However, the interrupt detection flag having the same value is stored in each of the memory cells M3a, M3b, M3c and M3d, just like the status memory unit 151. Specifically, the value of the interrupt detection flag, which is 1-bit information, is stored in all of the memory cells M3a, M3b, M3c and M3d. Therefore, in this exemplary embodiment, the interrupt detection memory unit 152 stores substantially 1-bit information.

As described above, the interrupt detection flag that is stored in the interrupt detection memory unit 152 is a flag indicating that writing to the data memory unit 150 has been interrupted. To be more specific, it is a flag indicating whether or not an interruption of writing occurs during writing in the 32 data memory units 150 connected to the same word line WL.

In this exemplary embodiment, when writing to the data memory unit 150 is not interrupted, "1" is stored as the interrupt detection flag value in each of the memory cells M3a, M3b, M3c and M3d. Thus, each of the memory cells M3a, M3b, M3c and M3d is set to the low threshold voltage state, for example. On the other hand, when writing to the data memory unit 150 is interrupted, "0" is stored as the interrupt detection flag value in each of the memory cells M3a, M3b, M3c and M3d. Thus, each of the memory cells M3a, M3b, M3c and M3d is set to the high threshold voltage state, for example.

Although the interrupt detection memory unit 152 is composed of four memory cells in this exemplary embodiment, this is merely an example, and the interrupt detection memory unit 152 may be composed of one or more memory cells. Note that, however, to obtain desired retention properties, the interrupt detection memory unit 152 is preferably composed of a plurality of memory cells, just like the status memory unit 151. Further, although one interrupt detection memory unit 152 is placed as the interrupt detection flag indicating the status of the 32 data memory units 150 connected to the same word line WL in this exemplary embodiment, one interrupt detection memory unit 152 may be placed for N (N is an integer of one or more) number of data memory units 150.

The interrupt detection flag that is stored in the interrupt detection memory unit 152 is read by the reference read mode. Thus, the bit line BL of the interrupt detection memory unit 152 is connected to a sense amplifier SA3 where the signal line IL through which the reference current Iref can flow is connected to the input side. Specifically, the bit line BL and the signal line IL are connected to the sense amplifier SA3 so as to sense a current difference between the current of the interrupt detection memory unit 152 and the reference current. To be specific, the bit lines BL of the memory cells M3a, M3b, M3c and M3d are connected to the sense amplifier SA3 in this exemplary embodiment. Note that, to be more specific, the bit line BL is connected to the sense amplifier SA3 through the transistor Tr.

The sense amplifier SA3, like the sense amplifier SA2, is a circuit that determines the value of the interrupt detection flag that is stored in the interrupt detection memory unit 152 by comparing the sum of currents (memory cell currents) flowing through the memory cells of the interrupt detection memory unit 152 with the reference current. Thus, the signal line IL through which the reference current Iref to be compared with the memory cell current flows is connected to the input side of the sense amplifier SA3. The signal line IL is connected to a constant current source CCS2 that supplies the reference current Iref. The sense amplifier SA3 outputs the determined interrupt detection flag value as a read result to the output driver 109. The interrupt detection flag is thereby output from the output driver 109.

As described above, the flash memory 300 can output the data D31 to D0, the status flag and the interrupt detection flag in response to a read request from the outside.

The case where the power supply voltage that is supplied to the micro controller 10 decreases to be lower than a specified voltage for some reasons is described hereinafter in detail. When the power supply voltage decreases during writing to the data memory unit 150 and the status memory unit 151, writing is not completed normally within a time period during which the voltage at which writing can be executed normally can be maintained, and there arises a possibility that a false value is stored in the memory cells. The data memory unit 150 and the status memory unit 151 are composed of 68 memory cells in total. On the other hand, the interrupt detection memory unit 152 is composed of 4 memory cells. Thus, the number of memory cells that constitute the interrupt detection memory unit 152 is smaller than the number of memory cells that constitute the data memory unit 150 and the status memory unit 151. Further, the number of memory cells that constitute the interrupt detection memory unit 152 is smaller than the number of memory cells in the data memory unit 150. In the case where the current value of a write current that is used for writing to the memory cell is the same, writing is completed in a shorter time when the number of memory cells to be written is smaller. Therefore, writing of the interrupt detection flag can be completed in a shorter time than writing to the data memory unit 150 and the status memory unit 151.

In this exemplary embodiment, when it is detected by the voltage monitoring circuit 600 that the power supply voltage becomes equal to or lower than the voltage decrease detection level during writing to the data memory unit 150, the flash sequencer 700 performs control to interrupt writing to the data memory unit 150 and write the interrupt detection flag value indicating an interruption to the interrupt detection memory unit 152. Thus, after the power supply voltage decreases, before the voltage becomes lower than the level at which writing can be executed normally, the write processing is interrupted and writing of the interrupt detection flag is carried out. Because writing of the interrupt detection flag can be completed in a short time as described above, the writing of the interrupt detection flag can be finished normally. Further, particularly, the flash sequencer 700 performs control to write the interrupt detection flag indicating an interruption to the interrupt detection memory unit 152 after interrupting writing to the data memory unit 150 in this exemplary embodiment. It is thereby possible to maximize the write current for the interrupt detection memory unit 152. In the case of performing writing to the interrupt detection memory unit 152 while continuing writing to the data memory unit 150, the write current is used in a distributed fashion for both of writing to the data memory unit 150 and writing to the interrupt detection memory unit 152. On the other hand, in this exemplary embodiment, writing to the interrupt detection memory unit 152 is carried out after interrupting writing to the data memory unit 150, and it is thereby possible to use the write current only for writing to the interrupt detection memory unit 152. It is thereby possible to further reduce the write time to the interrupt detection memory unit 152.

Figure 13:
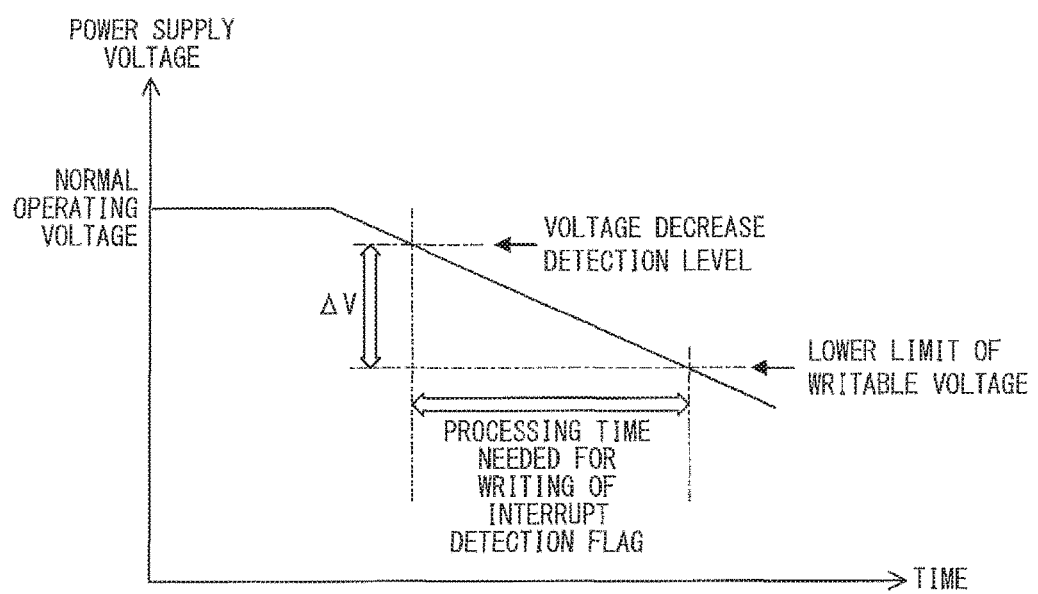
FIG. 13 is a graph showing an example of the temporal transition of a power supply voltage.

In this exemplary embodiment, the voltage monitoring circuit 600 performs detection so as to ensure a sufficient time for the writing to the interrupt detection memory unit 152 to end normally after detecting a decrease in the power supply voltage. A method of deciding the voltage decrease detection level that is set to the voltage monitoring circuit 600 is described hereinafter with reference to FIG. 13. A power supply voltage decrease rate per unit time can be obtained by the consumed current in the micro controller 10 and the capability on the power supply side such as the capacity of a capacitor added to the power supply line or the like. Thus, the voltage decrease detection level can be obtained by calculating a voltage value $\Delta V$ that decreases during the processing time required for writing of the interrupt detection flag according to this decrease rate and adding the voltage value $\Delta V$ to the lower limit of the writable voltage.

Note that, because a write time to the data memory unit 150 and the status memory unit 151 is longer than a write time to the interrupt detection memory unit 152, the voltage value (which is referred to as $\Delta Vds$) that decreases during the processing time required for writing to the data memory unit 150 and the status memory unit 151 is greater than the value $\Delta V$ described above. Thus, if $\Delta Vds$ is added to the lower limit of the writable voltage, it exceeds a normal operating voltage, which can make it unable to set the voltage decrease detection level. Further, if writing to the data memory unit 150 and the status memory unit 151 continues after the power supply voltage reaches the voltage decrease detection level that is set based on $\Delta V$, there is a possibility that writing cannot be completed at the time when the power supply voltage reaches the lower limit of the writable voltage. To avoid this, the voltage decrease detection level is set and write interrupt control is performed as described above in this exemplary embodiment.

Figure 14:
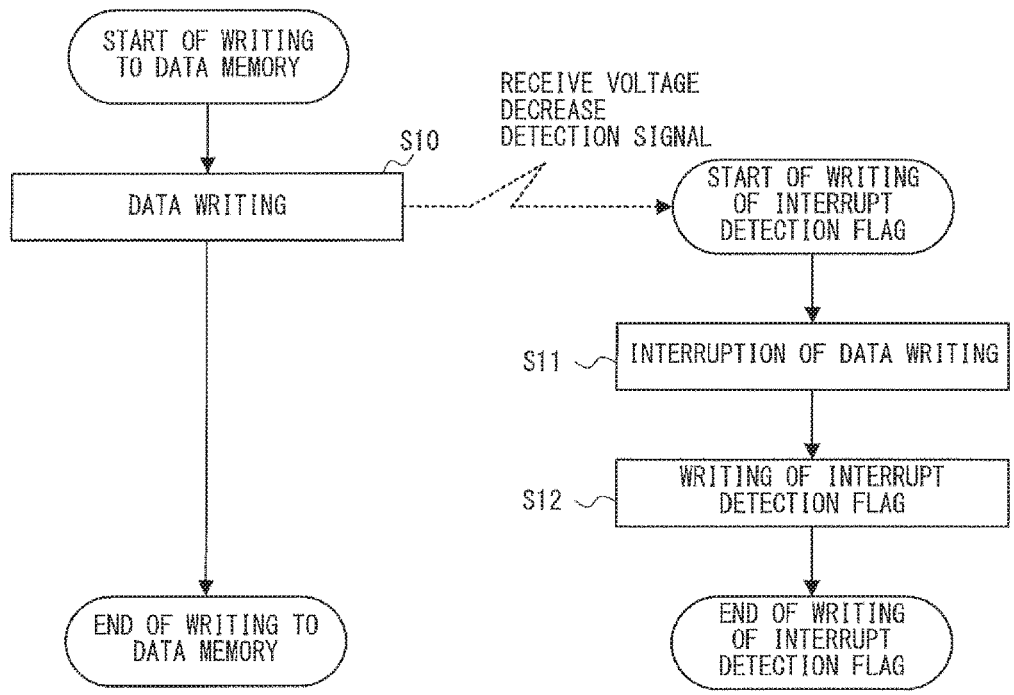
FIG. 14 is a flowchart showing an example of the operation of a flash sequencer during writing to a data memory unit.

The write operation in the micro controller 10 according to this exemplary embodiment is described hereinafter. FIG. 14 is a flowchart showing an example of the operation of the flash sequencer 700 during writing to the data memory unit 150. The operation is described by reference to FIG. 14. It is assumed that erasing of the interrupt detection memory unit 152 has been performed prior to the operation of the flowchart shown in FIG. 14, and "1" that is set during the erasing is stored as the interrupt detection flag value.

In Step 10 (S10), the flash sequencer 700 receives a write command to the data memory unit 150 and starts writing to the data memory unit 150. To be specific, in this exemplary embodiment, writing of the status flag of the status memory unit 151 is carried out simultaneously with writing to the data memory unit 150.

When the voltage decrease detection signal from the voltage monitoring circuit 600 is not received, the flash sequencer 700 continues processing until data writing is completed. When, on the other hand, the voltage decrease detection signal from the voltage monitoring circuit 600 is received during writing, the flash sequencer 700 starts writing of the interrupt detection flag.

In this processing, the flash sequencer 700 first interrupts writing to the data memory unit 150 in Step 11 (S11). To be specific, in this exemplary embodiment, the flash sequencer 700 interrupts writing to the data memory unit 150 and writing of the status memory unit 151. Next, in Step 12 (S12), the flash sequencer 700 performs writing of the interrupt detection flag. To be more specific, writing of the interrupt detection flag is carried out in the interrupt detection memory unit 152 corresponding to the data memory unit 150 where writing has been performed in Step 10. When writing of the interrupt detection flag is completed, "0" is stored as the interrupt detection flag value into the interrupt detection memory unit 152.

The third exemplary embodiment is described above. In this exemplary embodiment, the interrupt detection memory unit 152 that is read by the reference read mode and that stores the interrupt detection flag indicating whether an interruption of writing occurs or not is placed. It is thereby possible to determine whether there is an interruption of writing in the data memory unit 150 and the status memory unit 151. If the interrupt detection flag is read by the complementary read mode, when an interruption is detected and the interrupt detection flag is written in the past, "0" can be read even after erasing in the interrupt detection memory unit 152. This can cause a failure to determine the presence or absence of an interruption. On the other hand, because the interrupt detection memory unit 152 is read by the reference read mode in this exemplary embodiment, the value in the erased state is uniquely defined, thus preventing the above problem.

It should be noted that, although writing is performed simultaneously and erasing is also performed simultaneously in the data memory unit 150 and the status memory unit 151 in this exemplary embodiment, writing may be performed separately, and erasing may be performed separately.

Further, in this exemplary embodiment, the case where a decrease in voltage is notified from the voltage monitoring circuit 600 included in the micro controller 10 to the flash sequencer 700, and the flash sequencer 700 controls processing after the notification is described as an example. However, this may be implemented by another configuration. For example, a method for notifying a decrease in voltage may be any of the following three methods.

Notification method 1: Detection is done by a voltage monitoring circuit inside the micro controller 10, and notification is given by an internal signal (the notification method described as the third exemplary embodiment).

Notification method 2: Detection is done by a power supply control circuit outside the micro controller 10, and notification is given through an interrupt terminal of the micro controller 10.

Notification method 3: Detection is done by a power supply control circuit outside the micro controller 10, and notification is given through a reset terminal of the micro controller 10.

The voltage monitoring circuit and the power supply control circuit can be also referred to as a voltage detection unit (voltage detection circuit). Further, a destination of notification about a decrease in voltage and a processing method after notification may be any of the following three methods, for example.

Control method 1: Notification about a decrease in voltage is given to the flash sequencer 700. The flash sequencer 700 interrupts data writing and carries out writing of the interrupt detection flag (the control method described as the third exemplary embodiment).

Control method 2: Notification about a decrease in voltage is given to an interrupt controller (not shown) of the micro controller 10. Interruption of data writing and writing of the interrupt detection flag are instructed to the flash sequencer 700 by software processing of the CPU 400, and writing of the interrupt detection flag is carried out.

Control method 3: Notification about a decrease in voltage is given to a system control unit (not shown) of the micro controller 10. In the state where the elements other than the flash sequencer 700 and the flash memory 100 are reset, a signal indicating writing of the interrupt detection flag is output from the system control unit to the flash sequencer 700, and the flash sequencer 700 interrupts data writing and carries out writing of the interrupt detection flag.

Combinations of the notification methods and the control methods described above may be the following five combinations, for example. Specifically, an exemplary embodiment that combines the notification method 1 and the control method 1, an exemplary embodiment that combines the notification method 1 and the control method 2, an exemplary embodiment that combines the notification method 2 and the control method 1, an exemplary embodiment that combines the notification method 2 and the control method 2, an exemplary embodiment that combines the notification method 3 and the control method 3 may be implemented as an example of combinations.

Although the invention accomplished by the present inventor is specifically described using several exemplary embodiments in the foregoing, the present invention is not restricted to the above-described exemplary embodiments, and various changes and modifications may be made without departing from the scope of the invention. For example, although the interrupt detection memory unit 152 is added to the flash memory 200 according to the second exemplary embodiment in the third exemplary embodiment, the interrupt detection memory unit 152 may be added to the flash memory 100 according to the first exemplary embodiment.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A storage device, comprising:
   a write circuit;
   a data memory circuit configured to include a pair of first flash memory cells to be read by a complementary read mode, where complementary 1-bit data is stored in the pair of first flash memory cells by the write circuit; and
   a status memory circuit configured to include a plurality of second flash memory cells to be read by a reference read mode, where a status flag is stored in the flash memory cell by the write circuit,
   wherein the write circuit is configured to write the complementary 1-bit data to each of the pair of first flash memory cells, and to write the status flag of a same value to each respective second flash memory cell, the status flag indicating a data write status of the first flash memory cells, and
   wherein the storage device further comprises a determination circuit configured to determine a value of the status flag by comparing a sum current of currents flowing through the plurality of second flash memory cells with a reference current.

2. The storage device according to claim 1, wherein the determination circuit pre-charges a first signal line connected to each of the plurality of second flash memory cells and a second signal line connected to a current source configured to supply the reference current, discharges the first signal line and the second signal line by the sum current and the reference current, and compares the sum current with the reference current by comparing a voltage of the first signal line with a voltage of the second signal line after discharge.

3. The storage device according to claim 1, further comprising:
   an output circuit configured to carry out a logical OR between a read value of the data memory circuit and a read value of the status memory circuit, and output an operation result as a read result of the data memory circuit.

4. The storage device according to claim 1, further comprising:
   an interrupt detection memory circuit configured to include a third flash memory cell readable by the reference read mode, an interrupt detection flag indicating whether there is an interruption of writing or not being stored in the third flash memory cell;

a voltage detection circuit configured to detect whether a power supply voltage becomes equal to or lower than a specified value; and a control circuit configured to perform control to interrupt writing to the data memory circuit and write a value indicating an interruption to the interrupt detection memory circuit when the voltage detection circuit detects that the power supply voltage becomes equal to or lower than the specified value during writing to the data memory circuit.

5. The storage device according to claim 4, wherein the control circuit performs control to write a value indicating an interruption to the interrupt detection memory circuit after interrupting writing to the data memory circuit.

6. The storage device according to claim 4, wherein the voltage detection circuit includes a storage configured to store the specified value, and wherein the specified value is configured to be changed.

7. The storage device according to claim 1, wherein the write circuit is further configured to erase the data memory circuit and the status memory circuit simultaneously.

8. The storage device according to claim 1, wherein the status flag includes a flag indicating a data write status of the data memory circuit.

9. A storage method, comprising:

storing complementary 1-bit data into a pair of first flash memory cells to be read by a complementary read mode;

storing a status flag indicating a data write status of the first flash memory cells into each of second flash memory cells to be read by a reference read mode, wherein in the storing the status flag, the status flag having a same value is stored in each of the second flash memory cells; and determining a value of the status flag by comparing a sum current of currents flowing through the second flash memory cells with a reference current.

\* \* \* \* \*